(12) United States Patent
Lee

(10) Patent No.: US 8,395,962 B2
(45) Date of Patent: Mar. 12, 2013

(54) SEMICONDUCTOR MEMORY DEVICE AND METHOD FOR OPERATING THE SAME

(75) Inventor: Sang-Ho Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 250 days.

(21) Appl. No.: 12/827,530

(22) Filed: Jun. 30, 2010

(65) Prior Publication Data

US 2011/0002182 A1 Jan. 6, 2011

(30) Foreign Application Priority Data

Jul. 1, 2009 (KR) ........................ 10-2009-0059825

(51) Int. Cl.
*G11C 8/00* (2006.01)

(52) U.S. Cl. ..................... 365/230.06; 365/191; 365/193

(58) Field of Classification Search ............. 365/230.06, 365/191, 193–194, 189.05, 233.1
See application file for complete search history.

(56) References Cited

U.S. PATENT DOCUMENTS

| | | | |
|---|---|---|---|
| 6,172,919 B1 * | 1/2001 | Horikawa | 365/189.14 |
| 7,336,557 B2 * | 2/2008 | Sawada | 365/233.1 |
| 7,546,497 B2 * | 6/2009 | Jang | 714/718 |

* cited by examiner

*Primary Examiner* — David Lam
(74) *Attorney, Agent, or Firm* — IP & T Group LLP

(57) ABSTRACT

A semiconductor memory device includes a source signal generation unit configured to generate a source pulse signal having a pulse width which is determined depending on an interval between an input of an active signal and an input of a column command signal, which is inputted after an active command, and a column decoding unit configured to generate a column select signal in response to an address and the source pulse signal.

20 Claims, 5 Drawing Sheets

SEMICONDUCTOR MEMORY DEVICE AND METHOD FOR OPERATING THE SAME

CROSS-REFERENCE TO RELATED APPLICATIONS

The present application claims priority of Korean Patent Application No. 10-2009-0059825, filed on Jul. 1, 2009, which is incorporated herein by reference in its entirety.

BACKGROUND OF THE INVENTION

Exemplary embodiments of the present invention relate to semiconductor design technology, and more particularly, to a semiconductor memory device which generates a column select signal in response to a column command signal and performs data input/output operations using the generated signal.

In general, a semiconductor memory device such as a double data rate synchronous DRAM (DDR SDRAM) has at least tens of millions of memory cells for storing data, and the semiconductor memory device stores or outputs data in accordance with a command from a control unit, for example, a CPU. For example, when the CPU requests a write operation, data is stored in a memory cell corresponding to an address inputted from the CPU and, when the CPU requests a read operation, data stored in a memory cell corresponding to an address inputted from the CPU is outputted. During the write operation, data inputted through an input/output pad is inputted to the corresponding memory cell via a data input path. During the read operation, data stored in the corresponding memory cell is outputted to the outside through the input/output pad via a data output path.

FIG. 1 illustrates general read and write operations of a semiconductor memory device. For reference, tens of millions of memory cells may be inside a semiconductor memory device. However, for convenience of explanation, only one memory cell is illustrated and reference numeral 110 is designated thereto.

A read operation of the semiconductor memory device will be described briefly with reference to FIG. 1.

When a word line WL selected by decoding an inputted row address is enabled, a cell transistor T1 of the memory cell 110 is turned on, and data stored in a cell capacitor C1 is charge-shared with a bit line BL, which has been precharged, to be substantially equal to a voltage level of a bit line /BL. Through the charge-sharing operation, the bit lines BL and /BL come to have a slight potential difference. For reference, the level of the precharged voltage may correspond to half the level of a core voltage which is an internal voltage.

A bit line sense amplifier 120 may sense and amplify a slight potential difference between the bit lines BL and /BL. In other words, if the potential of the bit line BL is higher than the potential of the bit line /BL, a voltage of the bit line BL may be amplified to a pull-up voltage RTO, and a voltage of the bit line /BL may be amplified to a pull-down voltage SB.

Meanwhile, when a column select signal YI selected by decoding a column address inputted in accordance with a column command signal is activated, a transistor of a column selection unit 130 may be turned on to connect the bit lines BL and /BL to segment input/output lines SIO and /SIO), respectively. That is, data amplified in the bit line BL may be transferred to the segment input/output line SIO, and data amplified in the bit line /BL is transferred to the segment input/output line /SIO.

A transistor of an input/output switching unit 140 is turned on in response to an input/output control signal CTR_IO corresponding to the column address, and the segment input/output lines SIO) and /SIO are connected to local input/output lines LIO and /LIO, respectively. That is, the data transferred to the segment input/output line SIO may be transferred to the local input/output line LIO, and the data transferred to the segment input/output line /SIO may be transferred to the local input/output line /LIO. Finally, a read driving unit 150 may drive a global input/output line GIO, depending on the data transferred through the local input/output lines LIO and /LIO.

In summary, data stored in the memory cell 110 may be transferred from the bit lines BL and /BL to the segment input/output lines SIO and /SIO in response to the column select signal YI, and the data transferred to the segment input/output lines SIO and /SIO may be transferred to the local input/output lines LIO and /LIO in response to the input/output control signal CTR_IO. The data transferred to the local input/output lines LIO and /LIO may be transferred to the global input/output line GIO by the read driving unit 150. The data transferred in this manner may be finally outputted to the outside through a corresponding input/output pad (not shown).

On the other hand, data inputted from the outside during a write operation may be transferred in a direction opposite to that of the read operation. That is, data applied through the input/output pad may be transferred from the global input/output line GIO to the local input/output lines LIO and /LIO through a write driving unit 160, from the local input/output lines LIO and /LIO to the segment input/output lines SIO) and / SIO, and from the segment input/output lines SIO and /SIO) to the bit lines BL and /BL. The data transferred in this manner may be finally stored in the memory cell 110.

FIG. 2 is a block diagram illustrating a circuit for generating the column select signal YI of FIG. 1, specifically, a source signal generation unit 210 and a column decoding unit 230.

The source signal generation unit 210 is configured to generate a source pulse signal AYP having a constant pulse width in response to a read command RD activated during a read operation and a write command WT activated during a write operation in accordance with an external command. In general, the pulse width of the source pulse signal AYP may be determined based on an external clock signal.

The column decoding unit 230 is configured to decode an external column address ADD and generate a column select signal YI having a pulse width corresponding to the source pulse signal AYP. Here, the column select signal YI may refer to a signal activated in accordance with a result of decoding 'n' column addresses ADD.

FIG. 3 is a timing diagram illustrating an operation of the circuit illustrated in FIGS. 1 and 2.

Referring to FIGS. 1 to 3, when an active command ACT is applied, the corresponding word line WL may be enabled, and the bit lines BL and /BL may come to have a slight potential difference depending on the stored data. As mentioned above, the bit line sense amplifier 120 may sense and amplify the slight potential difference between the bit lines BL and /BL. When a read command RD or a write command WT is applied after a RAS (Row Access Strobe) to CAS (Column Access Strobe) delay tRCD, the column select signal YI may be activated after a period of time, and the bit lines BL and /BL and the local input/output lines LIO and /LIO may be connected together to transfer data. Here, a minimum value of the tRCD may be defined according to a point of time when the column select signal YI can be activated after the voltages of the bit lines BL and /BL are sufficiently amplified.

A semiconductor memory device may successively receive read and write commands RD and WT, which are column command signals. In this regard, a time interval between successive CAS (Column Access Strobe) signals may be referred to as tCCD (i.e., tCCD is a CAS to CAS Delay). In a semiconductor memory device, lines for transferring data may be precharged to a constant voltage. The time tCCD may be related to this requirement, and may be defined as a time interval from a time at which one column select signal YI is activated to transfer data, to a time at which the next column select signal YI is activated to transfer data after respective lines are precharged again. For stable data transfer, a stable precharging operation may be completed within the time tCCD.

FIGS. 4A and 4B are timing diagrams illustrating circuit operation of a conventional semiconductor memory device, based on the tRCD. The tRCD may have minimum and maximum values. Here, the minimum value refers to the earliest time when a column select signal YI can be activated, and the maximum value refers to the latest time when a preceding (first) column select signal YI can be applied while the time tCCD is secured with reference to a second column select signal YI.

FIG. 4A shows a case in which the tRCD has the maximum value.

Referring to FIGS. 3 and 4A, data of the bit lines BL and /BL may be amplified after the input of an active command ACT. Then, the column select signal YI (a first YI) may be activated, and the data of the bit lines BL and /BL may be transferred to the local input/output lines LIO and /LIO. After the tCCD, the next column select signal YI (a second YI) may be activated, and data of the bit lines BL and /BL may be transferred to the local input/output lines LIO and /LIO.

FIG. 4B shows a case in which the tRCD has the minimum value.

Referring to FIGS. 3 and 413, after the input of the active command ACT, the column select signal YI may be activated earlier than in the case of FIG. 4A. Even when the column select signal YI may be activated at the minimum value of the tRCD, data of the bit lines BL and /BL may be transferred to the local input/output lines LIO and /LIO. A factor to be considered in this regard is the pulse width of the column select signal YI If the pulse width of the column select signal YI is too small, there is a possibility that an amplification operation of the bit lines BL and /BL will become insufficient, Therefore, the column select signal YI may have a relatively large pulse width.

Referring again to FIG. 2, the pulse width of the column select signal YI in the case of a conventional semiconductor memory device may be the same as the source pulse signal AYP. That is, the column select signals YI shown in FIGS. 4A and 4B have the same pulse width of t1. In this case, the pulse width of the column select signals YI may be designed for a case in which the tRCD has a minimum value. In other words, all column select signals YI have a relatively large pulse width of t1. In order to guarantee an acceptable amplification operation when the tRCD has a minimum value, it may be necessary to set a relatively large pulse width of the column select signals YI.

However, when column select signals YI have a large pulse width, a sufficient precharging time may not be guaranteed in the time tCCD. In other words, the time tCCD between deactivation of a column select signal YI (a first YI) and activation of the next column select signal YI (a second YI) may be too short to guarantee sufficient completion of a precharging operation. Failure to secure a sufficient precharging time means that a stable data transfer operation of the semiconductor memory device may not be guaranteed.

SUMMARY OF THE INVENTION

An exemplary embodiment of the present invention is directed to a semiconductor memory device capable of adjusting the pulse width of column select signals according to the point of time when a column command signal is applied after an active command.

In accordance with an exemplary embodiment of the present invention, a semiconductor memory device includes a source signal generation unit configured to generate a source pulse signal having a pulse width which is determined depending on an interval between an input of an active signal and an input of a column command signal which is inputted after an active command, and a column decoding block configured to generate a column select signal in response to an address and the source pulse signal.

In accordance with another exemplary embodiment of the present invention, a semiconductor memory device includes a source signal generation unit configured to generate a source pulse signal having a first or second pulse width in accordance with an input time of a column command signal, and a column decoding unit configured to generate a column select signal in response to an address and the source pulse signal.

In accordance with yet another exemplary embodiment of the present invention, a method for operating a semiconductor memory device includes generating a column select signal having a first pulse width with regard to a column command signal applied before a certain point of time after an active command, and generating a column select signal having a second pulse width with regard to a column command signal applied after the certain point of time.

A semiconductor memory device in accordance with an exemplary embodiment of the present invention can adjust the pulse width of a column select signal in accordance with the point of time when a column command signal is applied after an active command so that, when the tRCD corresponds to a minimum value, a sufficient amplification operation of bit lines is guaranteed and, when the tRCD corresponds to a maximum value, a sufficient precharging operation is guaranteed in the tCCD interval.

DESCRIPTION OF SPECIFIC EMBODIMENTS

Figure 1:
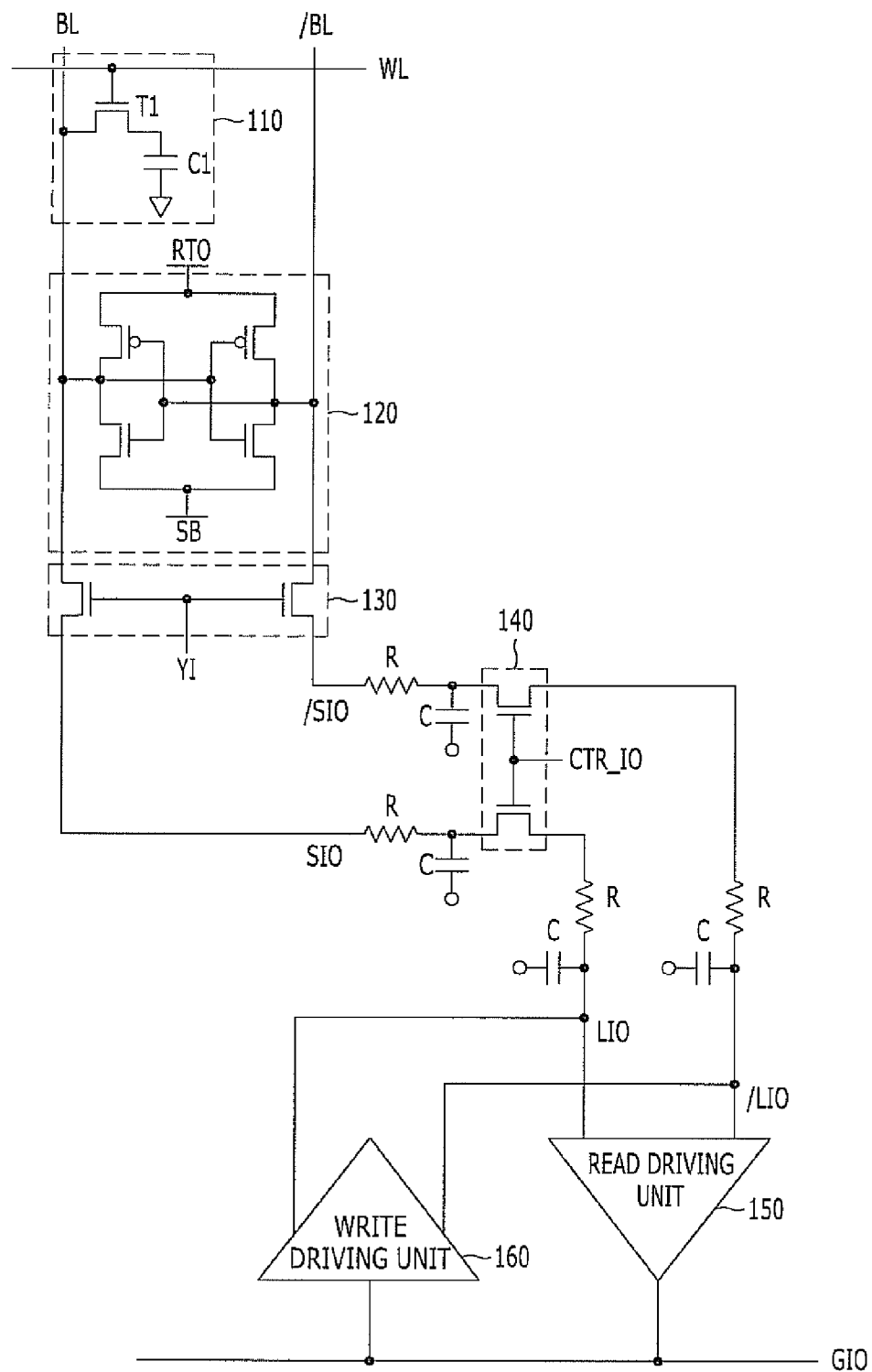
FIG. 1 illustrates general read and write operations of a semiconductor memory device.
Figure 2:
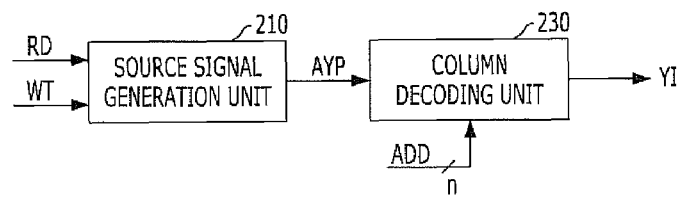
FIG. 2 is a block diagram illustrating a circuit for generating a column select signal YI of FIG. 1.
Figure 3:
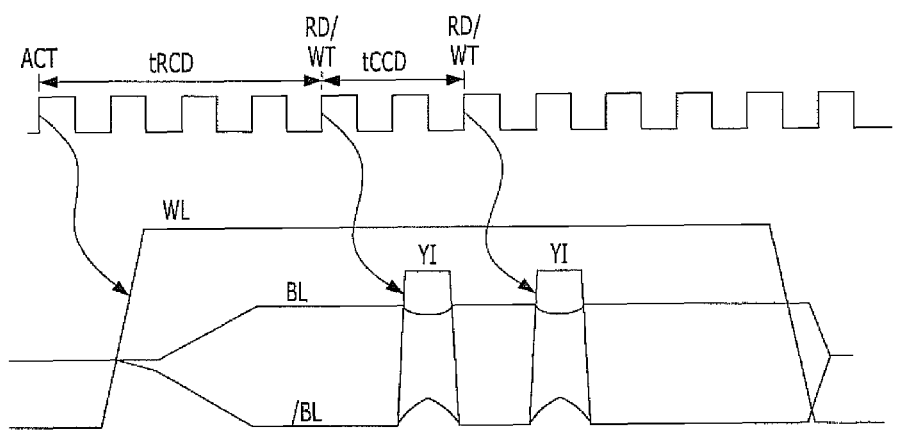
FIG. 3 is a timing diagram illustrating an operation of the circuit shown in FIGS. 1 and 2.
Figure 4A:
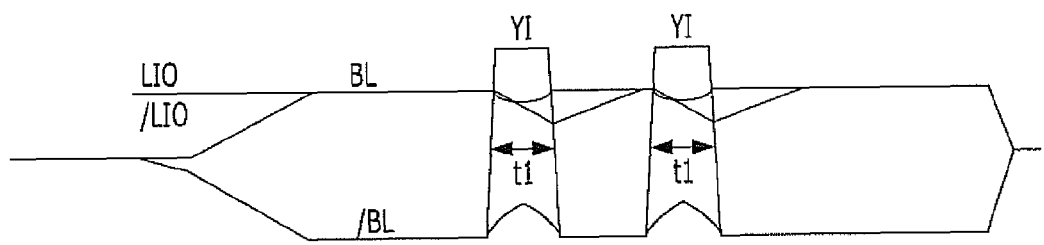
FIGS. 4A and 4B are timing diagrams illustrating a circuit operation of a conventional semiconductor memory device based on tRCD.
Figure 4B:
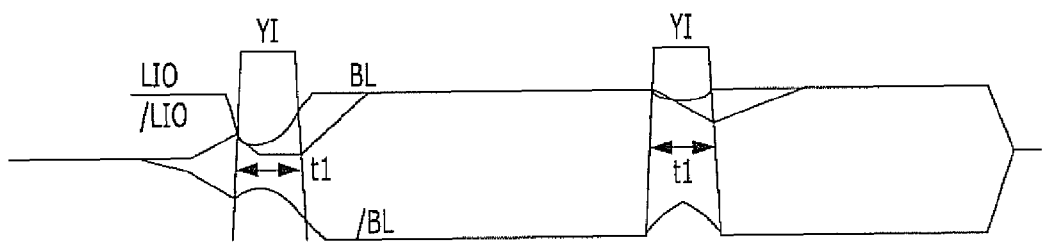

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 5:
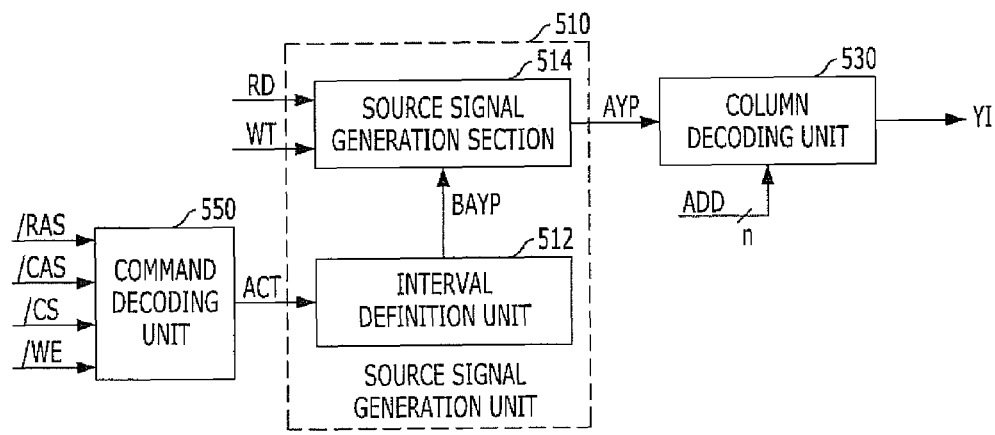
FIG. 5 is a block diagram illustrating a circuit for generating a column select signal YI in accordance with an exemplary embodiment of the present invention.

FIG. 5 is a block diagram illustrating a circuit for generating a column select signal YI in accordance with an exemplary embodiment of the present invention, which may include a source signal generation block 510, a column decoding block 530, and a command decoding block 550.

The source signal generation unit 510 is configured to generate a source pulse signal AYP having a pulse width which is determined depending on an interval between an input of an active signal ACT and an input of a column command signal, for example, read or write commands RD or WT, which is input after an active command. Further, the source signal generation unit 510 may include an interval definition unit 512 and a source signal generation section 514.

The interval definition unit 512 is configured to generate an interval definition signal BAYP activated at a certain time after the active command ACT. The certain time after the active command ACT may correspond to a case in which tRCD has a minimum value. That is, the interval definition signal BAYP may transfer information corresponding to the minimum tRCD after the active command ACT to the source signal generation section 514. For reference, information about values other than the minimum value may be transferred depending on design requirements.

The source signal generation section 514 is configured to output a source pulse signal AYP in response to the column command signal and the interval definition signal, wherein a pulse width of the source pulse signal is determined in accordance with the interval definition signal BAYP at the input of column command signal, for example, the read and write commands RD and WT. That is, the source pulse signal AYP has a pulse width adjusted depending on information transferred from the interval definition unit 512, and in particular, information of the tRCD, for example, the minimum tRCD.

The column decoding block 530 is configured to decode a column address ADD applied from the outside and generate a column select signal YI having a pulse width corresponding to the source pulse signal AYP, depending on the decoding result. Here, the column select signal YI may refer to a signal activated in accordance with a result of decoding n column addresses ADD.

Meanwhile, the active command ACT applied to the interval definition unit 512 may be generated by the command decoding block 550, which is configured to generate the active command ACT by decoding a row address strobe signal /RAS, a column address strobe signal /CAS, a chip select signal /CS, a write enable signal /WE, etc., which are applied from the outside.

For convenience, it will be assumed that the source pulse signal AYP outputted from the source signal generation unit 514 may have a first or second pulse width according to the point of time at which the read and write commands RD and WT are applied, with reference to a certain time after the active command ACT.

Figure 6:
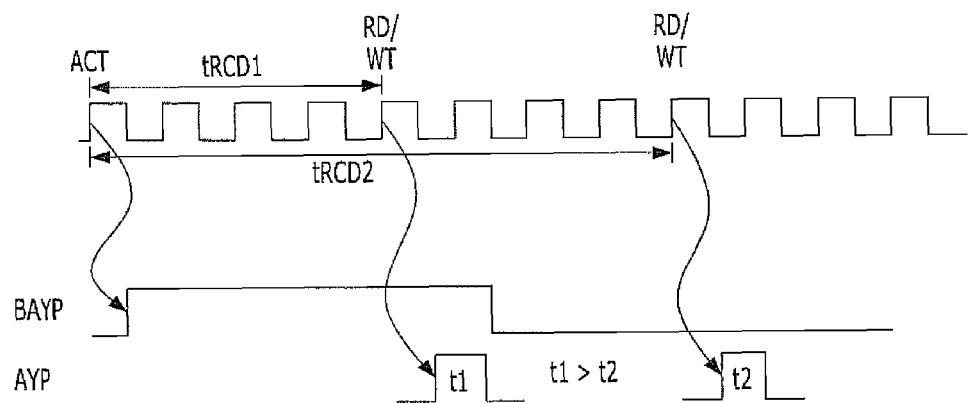
FIG. 6 is a timing diagram illustrating an exemplary operation of the circuit shown in FIG. 5.

FIG. 6 is a timing diagram illustrating an exemplary operation of the circuit illustrated in FIG. 5. The interval definition signal BAYP may maintain a logic high level during an interval where the tRCD corresponds to a minimum value after the active command ACT, and may maintain a logic low level in the subsequent interval.

Also, the interval definition signal BAYP may maintain a logic high level until a time which is a certain time after the minimum tRCD from the active command.

Referring to FIGS. 5 and 6, when read and write commands RD and WT are applied during an interval where the tRCD does not exceed the minimum value (e.g., tRCD1) after the active command ACT, the source pulse signal AYP may have a pulse width of t1 according to the logic high interval definition signal BAYP. The pulse width t1 of the source pulse signal AYP may correspond to the pulse width of the following column select signal YI. When read and write commands RT and WT are applied during an interval where the tRCD exceeds the minimum value tRCD after the active command ACT (e.g., during a tRCD2 interval), the source pulse signal AYP may have a pulse width of t2 in accordance with the logic low interval definition signal BAYP. The pulse width t2 of the source pulse signal AYP may correspond to the pulse width of the following column select signal YI. Here, t1 may be greater than t2.

The source pulse signal AYP may be activated in response to the column command signals, for example, the read and write commands RD and WT, and may be deactivated at a certain time t1 after the activation. When the tRCD is small (e.g., tRCD1), i.e., when the column command signals are relatively close to the activation time of the active signal ACT, the deactivation time of the source pulse signal AYP may be delayed so that the pulse width of the source pulse signal AYP increases. When the tRCD is large (e.g., tRCD2), i.e., when the column command signals are relatively far from the activation time of the active signal ACT, the deactivation time of the source pulse signal AYP may not be delayed or may have a relatively short delay.

As such, the semiconductor memory device in accordance with an exemplary embodiment of the present invention can adjust the pulse width of the source pulse signal AYP, depending on the application time of the read and write commands RW and WT after the active command ACT. The adjustment of the source pulse signal AYP may mean adjustment of the pulse width of the column select signal YI Therefore, the semiconductor memory device in accordance with an exemplary embodiment of the present invention may set a large pulse width (t1) of the column select signal YI, when the tRCD is less than a minimum value (e.g., tRCD1), so that a data sense amplification operation may be performed sufficiently and may set a small pulse width (t2) of the column select signal YI, when the tRCD is greater than a minimum value (e.g., tRCD2), so that sufficient time for a precharging operation may be secured in the tCCD.

Figure 7:
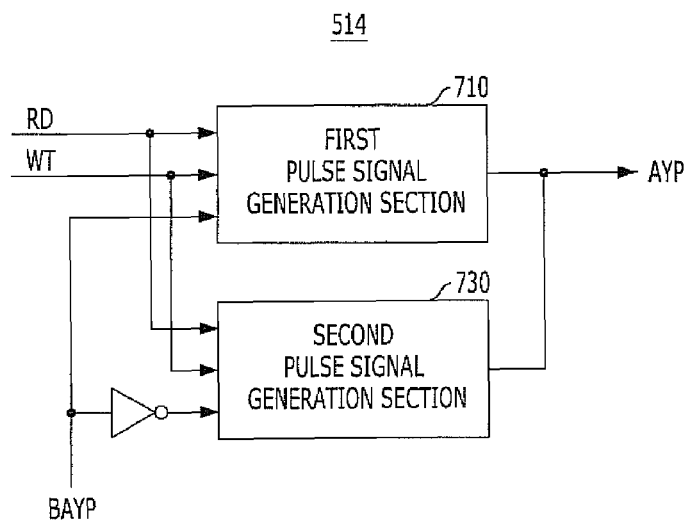
FIG. 7 is a block diagram illustrating a source signal generation section 514 of FIG. 5 in accordance with an exemplary embodiment of the present invention.

FIG. 7 is a block diagram illustrating the source signal generation section 514 of FIG. 5 in accordance with an exemplary embodiment of the present invention, and shows a construction for generating source pulse signals AYP having first and second pulse widths.

Referring to FIG. 7, the source signal generation section 514 may include a first pulse signal generation section 710 and a second pulse signal generation section 730.

The first pulse signal generation section 710 is configured to generate a source pulse signal AYP having a first pulse width in response to read and write commands RD and WT and an interval definition signal BAYP. The second pulse signal generation section 730 is configured to generate a source pulse signal AYP having a second pulse width in response to read and write commands RD and WT and a signal obtained by inverting the interval definition signal BAYP. The first and second pulse widths are different from each other. In other words, the first pulse width may correspond to t1 of FIG. 6, and the second pulse width may correspond to t2. That is, the first pulse width may be greater than the second pulse width.

The interval definition signal BAYP may be used as a signal to activate the first and second pulse signal generation sections 710 and 730. While the interval definition signal BAYP is at a logic high level, the first pulse signal generation section 710 may be enabled to generate a source pulse signal AYP having a pulse width of t1. While the interval definition signal BAYP is at a logic low level, the second pulse signal generation section 730 may be enabled to generate a source pulse signal AYP having a pulse width of t2. The second pulse signal generation section 730 may be enabled after the first pulse signal generation section 710 is disabled. Consequently, in accordance with an exemplary embodiment of the present invention shown in FIG. 7, the source pulse signals AYP having different pulse widths depending on the interval definition signal BAYP may be generated.

Figure 8:
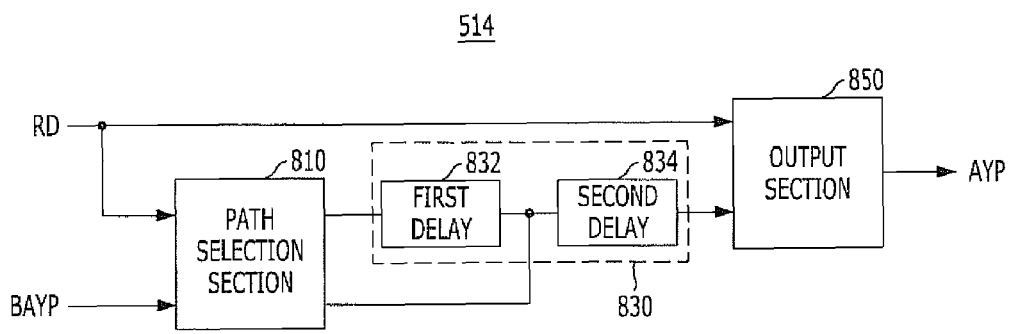
FIG. 8 is a block diagram illustrating a source signal generation section 514 of FIG. 5 in accordance with another exemplary embodiment of the present invention.

FIG. 8 is a block diagram illustrating the source signal generation section 514 of FIG. 5 in accordance with another exemplary embodiment of the present invention. For convenience, it will be assumed that only a read command RD is inputted as a pulse signal.

Referring to FIG. 8, the source signal generation section 514 may include a path selection section 810, a delay section 830, and an output section 850.

The path selection section 810 is configured to transfer a read command RD to a first or second delay 832 or 834, which corresponds to a delay path of the delay section 830. For example, the read command RD may be transferred to the first delay unit 832 when the interval definition signal BAYP is at a logic high level, and may be transferred to the second delay unit 834 when the interval definition signal BAYP is at a logic low level. That is, when the interval definition signal BAYP is at a logic high level, a delay amount may correspond to both the first and second delays 832 and 834. On the other hand, when the interval definition signal BAYP is at a logic low level, a delay amount may correspond to the second delay unit 834.

The delay section 830 is configured to adjust a delay amount corresponding to the interval definition signal BAYP, and may include the first delay 832 and the second delay 834. Although the first and second delays 832 and 834 are connected in series to each other in this case, delay circuits having different delay amounts may be connected in parallel depending on design requirements.

The output section 850 is configured to output a source pulse signal AYP in response to the read command RD and the output signal of the delay section 830. When the delay amount corresponding to both the first and second delays 832 and 834 is reflected into the read command RD, the pulse width of the source pulse signal AYP may increase accordingly. When the delay amount corresponding to the second delay 834 is reflected into the read command RD, the pulse width of the source pulse signal AYP may decrease accordingly. That is, in this exemplary embodiment of FIG. 8, the source pulse signals AYP having different pulse widths depending on the interval definition signal BAYP may be generated.

As mentioned above, the semiconductor memory device in accordance with an exemplary embodiment of the present invention can selectively adjust the pulse width of the source pulse signal AYP in accordance with the point of time when a column command signal is inputted after an active command. The source pulse signal AYP may additionally reflect address information later and may become a column select signal YI. Therefore, the pulse width of the column select signal YI may be adjusted in accordance with the tRCD based on an applied column command signal. Consequently, a column select signal YI having a pulse width that guarantees a sufficient amplification operation may be generated, in response to a column command signal applied while the tRCD corresponds to its minimum value, and a column select signal YI having a pulse width that may guarantee a sufficient precharging operation may be generated, in response to a column command signal applied after the minimum value of the tRCD.

In accordance with exemplary embodiments of the present invention, the pulse width of a column select signal is adjusted in accordance with the point of time when a column command signal is applied. Therefore, a stable data transfer operation may be guaranteed.

It has been assumed in the above description of an exemplary embodiment of the present invention that the column select signal YI having a pulse width of t1 or t2 is generated with reference to the minimum value of the tRCD. However, the present invention is also applicable to other cases in which column select signals YI have more detailed and diversified pulse widths.

While the present invention has been described with respect to the specific exemplary embodiments, it will be apparent to those skilled in the art that various changes and modifications may be made without departing from the spirit and scope of the invention as defined in the following claims.

What is claimed is:

1. A semiconductor memory device comprising:
   a source signal generation unit configured to generate a source pulse signal having a pulse width which is determined depending on an interval between an input of an active signal and an input of a column command signal, which is inputted after an active command; and
   a column decoding unit configured to generate a column select signal in response to an address and the source pulse signal.

2. The semiconductor memory device of claim 1, further comprising a command decoding unit configured to generate the active signal corresponding to an active command in response to an external command signal.

3. The semiconductor memory device of claim 1, wherein the source signal generation unit comprises:
   an interval definition unit configured to generate an interval definition signal in response to the active signal; and
   a source signal generation section configured to output the source pulse signal in response to the column command signal and the interval definition signal, wherein a pulse width of the source pulse signal is determined in accordance with the interval definition signal at the input of column command signal.

4. The semiconductor memory device of claim 3, wherein the interval definition signal is activated until a time which is a minimum value of a RAS to CAS delay (tRCD) after the active command.

5. The semiconductor memory device of claim 3, wherein the interval definition signal is activated until a time which is a certain time after a minimum value of a RAS to CAS delay (tRCD) from the active command.

6. The semiconductor memory device of claim 3, wherein the source pulse signal is activated in response to the column command signal and is deactivated in response to deactivation of the interval definition signal.

7. A semiconductor memory device comprising:
- a source signal generation unit configured to generate a source pulse signal having a first or second pulse width in accordance with an input time of a column command signal; and
- a column decoding unit configured to generate a column select signal in response to an address and the source pulse signal.

8. The semiconductor memory device of claim 7, wherein the source signal generation unit comprises:
- an interval definition unit configured to generate an interval definition signal activated for a certain time after an input of an active command; and
- a source signal generation section configured to output the source pulse signal in response to the column command signal, wherein the source pulse signal has the first pulse width if the column command signal is input before a deactivation of the interval definition signal and the source pulse signal has the second pulse width if the column command signal is input after the deactivation of the interval definition signal.

9. The semiconductor memory device of claim 8, wherein the deactivation of the interval definition signal is determined based on a minimum value of a RAS to CAS delay (tRCD).

10. The semiconductor memory device of claim 7, wherein the first pulse width is greater than the second pulse width.

11. The semiconductor memory device of claim 8, wherein the source signal generation section comprises:
- a first pulse signal generation section configured to generate the source pulse signal having the first pulse width in response to the column command signal and the interval definition signal; and
- a second pulse signal generation section configured to generate the source pulse signal having the second pulse width in response to the column command signal and the interval definition signal.

12. The semiconductor memory device of claim 11, wherein the first pulse signal generation section is enabled before a deactivation of the interval definition signal, and the second pulse signal generation section is enabled after the first pulse signal generation section is disabled.

13. The semiconductor memory device of claim 8, wherein the source signal generation section comprises:
- a delay section configured to reflect a delay amount, corresponding to the interval definition signal, in the column command signal; and
- an output section configured to output the source pulse signal in response to the column command signal and an output signal of the delay section.

14. The semiconductor memory device of claim 12, further comprising a path selection section configured to select a delay path of the delay section in response to the interval definition signal.

15. The semiconductor memory device of claim 12, wherein the delay section comprises:
- a first delay configured to reflect a first delay amount in the column command signal; and
- a second delay configured to reflect a second delay amount in the column command signal, the second delay amount being greater than the first delay amount.

16. The semiconductor memory device of claim 8, further comprising a command decoding unit configured to generate an active signal corresponding to the active command in response to an external command signal.

17. The semiconductor memory device of claim 16, wherein the source pulse signal is activated in response to the column command signal and is deactivated in response to deactivation of the interval definition signal.

18. A method for operating a semiconductor memory device, comprising:
- generating a column select signal having a first pulse width with regard to a column command signal applied before a certain point of time after an active command; and
- generating a column select signal having a second pulse width with regard to a column command signal applied after the certain point of time.

19. The method of claim 18, wherein the first pulse width is greater than the second pulse width.

20. The method of claim 18, wherein the certain point of time after an active command is determined in accordance with a minimum value of a RAS to CAS delay (tRCD).

* * * * *